US009490519B2

(12) United States Patent
Lilly et al.

(10) Patent No.: US 9,490,519 B2

(45) Date of Patent: Nov. 8, 2016

(54) TRANSMISSION LINE TRANSFORMER ANTENNA

(71) Applicants: James D Lilly, Silver Spring, MD (US); Minor C Wilson, Laurel, MD (US)

(72) Inventors: James D Lilly, Silver Spring, MD (US); Minor C Wilson, Laurel, MD (US)

( * ) Notice: Subject to any disclaimer, the term of this patent is extended or adjusted under 35 U.S.C. 154(b) by 24 days.

(21) Appl. No.: 14/662,982

(22) Filed: Mar. 19, 2015

(65) Prior Publication Data

US 2016/0276728 A1 Sep. 22, 2016

(51) Int. Cl.

*H03H 7/38* (2006.01)
*H01P 5/10* (2006.01)
*H01P 5/12* (2006.01)
*H01P 5/02* (2006.01)
*H01Q 1/50* (2006.01)
*H01P 3/06* (2006.01)

(52) U.S. Cl.

CPC . *H01P 5/02* (2013.01); *H01P 3/06* (2013.01); *H01Q 1/50* (2013.01)

(58) Field of Classification Search

CPC ............ H01Q 1/50; H01Q 1/00; H01H 7/38; H01P 5/10; H01P 5/12; H01P 3/08
USPC ....... 343/862, 905; 333/128, 136, 26, 33, 34
See application file for complete search history.

(56) References Cited

U.S. PATENT DOCUMENTS 3,614,676 A * 10/1971 Boelke ...................... H01P 5/10 333/26
2013/0181803 A1* 7/2013 Wyville .................. H01F 19/04 336/232

* cited by examiner

*Primary Examiner* — Hoang V Nguyen

(57) ABSTRACT

The present invention is drawn a transmission line transformer that uses specifically displaced beads of impedance increasing material on the coaxial transmission lines. The beads of impedance increasing material greatly reduce induced back currents on the outer surfaces of the coaxial transmission lines, which reduces losses and improves performance. The specific displacement of the beads enables the coaxial transmission lines to be compactly disposed within a heat sink.

20 Claims, 12 Drawing Sheets

TRANSMISSION LINE TRANSFORMER ANTENNA

BACKGROUND

The present invention generally relates to hand held communication devices employing whip antennas. A whip antenna is an antenna having a single straight flexible wire or rod. The bottom end of the whip is connected to the radio receiver or transmitter.

For hand-held long range communications, the band is typically in the range of 2-30 MHz. The shorter frequencies have the ability to follow the contours of Earth. This is one of the few benefits over high frequency communications, which may be more limited to line of sight. Unfortunately, as frequency reduces, the whip length should increase to maintain efficiency.

Some conventional hand-held whip antenna communication devices that operate in the 90-500 MHz band have a whip antenna of lengths of about four feet. Such a length is not very practical for a hand-held device. A tri-fold version provides a collapsible antenna having a much shorter length when not in use. However the folded antenna must be deployed to the full 4 ft length for use. Another type of conventional hand-held whip antenna communication device uses a twelve inch whip antenna. This conventional "short" whip antenna employs a transformer to reduce impedance mismatch between the signal generator and the antenna. This will be described in reference to FIG. 1.

FIG. 1 illustrates a short whip antenna transmission system 100.

As shown in the figure, transmission system 100 includes a signal generator 102, a transformer 104 and an antenna 106. Signal generator 102 is connected to transformer 104 at a node 108 and transformer 104 is connected to antenna 106 at a node 110.

Signal generator 102 generates an alternating current signal for use by antenna 106 to transmit a corresponding radiated signal. Transformer 104 reduces an impedance mismatch between signal generator 102 and antenna 106. Antenna 106 is a short whip antenna for transmitting in the 90-500 MHz range.

In this example, the output impedance of signal generator 102, at node 110, is 50 Ω and the input impedance of antenna, at node 110, is 300 Ω. Such an impedance mismatch would drastically reduce the efficiency of transmission system 100. Tremendous heat is generated by transformer 104. As a result a heat sink is used to transfer and dissipate heat to the environment. This will be described with reference to FIG. 2.

FIG. 2 illustrates a conventional short antenna 200 for transmitting at least 90 MHz.

As shown in the figure, conventional short antenna 200 includes a connector 202, a circuit board 204, a short whip antenna portion 206 and a heat sink 208. Circuit board 204 includes a toroidal transformer 210.

Connector 202 is connected to circuit board 204, which is additionally connected to short whip antenna portion 206. Heat sink 208 is thermally connected to toroidal transformer 210.

Connector 202 receives a signal from a signal generator (not shown) and conducts the signal to circuit board 204. Consider the situation where the signal generator has an output impedance of 50 Ω and short whip antenna portion 206 has an input impedance of 300 Ω. Just as discussed above with reference to FIG. 1, in this case, toroidal transformer 210 provides an impedance matching function. However, toroidal transformer 210 generates heat, which is dissipated via heat sink 208.

FIG. 3 illustrates a cross-sectional view of heat sink 208 along plane X-X of FIG. 2.

As shown in FIG. 3, heat sink 208 includes a tubular body 302 and a plurality of heat fins, a sample of which is numbered 304. Tubular body has a hollow center 306.

Returning to FIG. 2, as heat is generated by toroidal transformer 210, the heat is conducted to tubular body 302 of heat sink 208. Tubular body 302 then conducts the heat through its fins, for dissipation to the environment.

Connector 202 may be a standard coaxial connector. Heat sink 208 is manufactured to fit connector 202 and connect to standard short whip antennas, such as short whip antenna portion 206. The combined function of the impedance matching of toroidal transformer 210 with the heat dissipating function of heat sink 208 enables to somewhat efficient short whip antenna hand held communication device operable at lower frequencies. This will be described with reference to FIG. 4.

FIG. 4 illustrates a graph 400 of VSWR as a function of frequency of the driving signal.

As shown in the figure, graph 400 includes a Y-axis 402, an X-axis 404, a function 406, a function 408, a function 410, and a dotted line 412.

Y-axis 402 is a voltage standing wave ratio (VSWR). A standing wave ratio (SWR) is a measure of impedance matching of loads to the characteristic impedance of a transmission line. The SWR may be thought of in terms of the maximum and minimum AC voltages along the transmission line, thus being called the VSWR. In graph 400, Y-axis 402 is the VSWR and is measured logarithmically. It is a goal to reduce the VSWR as much as possible for the band with which a transmitter will be transmitting. In other words, with the respect to VSWR, the lower—the better.

X-axis 404 is frequency in MHz of the transmitted signal.

Function 406 corresponds to the VSWR as a function of frequency of to transmission system having a four foot long whip antenna. Function 408 corresponds to the VSWR as a function of frequency of a transmission system having a four foot long tri-fold whip antenna. Function 410 corresponds to the VSWR as a function of frequency of a transmission system having a short whip antenna as illustrated in FIG. 2.

Dotted line 412 represents a VSWR threshold for a particular transmitter requirement. In this example, dotted line 412 highlights a VSWR value of 3.

As shown in the graph, function 406 has a VSWR value below 3 from about 80-120 MHz, whereas function 408 has a VSWR value below 3 from about 80-105 MHz. Function 410 has a VSWR value below 3 at greater than about 90 MHz.

What is needed is a short whip antenna that can provide a VSWR value below 3 at less than 90 MHz and that can fit within a conventional heat sink as shown in FIG. 2.

BRIEF SUMMARY

The present invention provides a short whip antenna that can provide a VSWR value below 3 at less than 90 MHz and that can fit within a conventional heat sink as shown in FIG. 2

An aspect of the present invention is drawn to device that includes an input port, an antenna, an output port, a transmission line transformer, a first amount of a first impedance increasing material and a second amount of a second impedance increasing material. The input port can receive an unbalanced input radio frequency signal. The antenna can transmit an unbalanced transmission signal based on the input radio frequency signal. The output port is connected to the antenna. The transmission line transformer is disposed between the input port and the output port. The transmission line transformer includes n transmission lines, wherein each of the n transmission lines has a first end, a second end separated from the first end by a length, an axial conducting core and a coaxial conducting sheathing electrically separated from the axial conducting core. Each of the coaxial conducting sheathings is connected to ground at the first end. An axial conducting core at a second end of one of the transmission lines is electrically connected to a second end of a coaxial conducting sheathing of another of the transmission lines. An axial conducting core at the second end of the another of the transmission lines is electrically connected to the output port. The first amount of a first impedance increasing material is disposed with the one of the transmission lines to inhibit common-mode current from flowing on the outer surface of the coaxial conducting sheathing of the one of the transmission lines. The second amount of a second impedance increasing material is disposed with another of the transmission lines to inhibit common-mode current from flowing on the outer surface of the coaxial conducting sheathing of the another of the transmission lines. The second amount of a second impedance increasing material is greater than the first amount of a first impedance increasing material.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

The present invention is drawn a short whip antenna using a transmission line transformer for impedance matching, between the signal generator and the short whip antenna. Further, the transmission line transformer uses specifically displaced beads of impedance increasing material on the coaxial transmission line transformers. The beads of impedance increasing material greatly reduce induced back currents (common-mode currents) on the outer surfaces of the coaxial transmission line transformers, which decreases interference with the transmitted signal from the short Whip antenna. The specific displacement of the beads enables the coaxial transmission line transformers to be compactly disposed within a heat sink.

Transmission line transformers are well known. However, they are typically used between a balanced input and unbalanced output—as a "balun." In accordance with aspects of the present invention, a transmission line transformer is used between an unbalance input and an unbalanced output—as an "unun."

In a balanced system, a coaxial transmission line transformer carries equal and opposite currents on its outer conducting sheathing and its inner conducting core. In an unbalanced system, the currents on the outer conducting sheathing and the inner conducting core are unequal. Unopposed current on the outer conducting sheathing is called common-mode current, which promotes external coupling and radiation, increases network losses, and raises VSWR. These effects are detrimental to the efficiency and performance of an antenna, and therefore should be minimized.

Returning to FIG. 2, as discussed above, connector 202 is a coaxial connector and is therefore an unbalanced input. Further, short whip antenna portion 206 is an unbalanced input. As such, a transmission line transformer in accordance with aspects of the present invention may be used in conjunction with connector 202 and short whip antenna portion 206. In this manner, a transmission line transformer in accordance with aspects of the present invention is an unbalanced to unbalanced transformer, or an unun transformer.

Aspects of the present invention will now be described with reference to FIGS. 5-14.

A first aspect of the invention is drawn to the use of a transmission line transformer for impedance matching between an unbalance input line and an unbalanced short whip antenna. This aspect will be described with reference to FIGS. 5-6.

Figure 5:
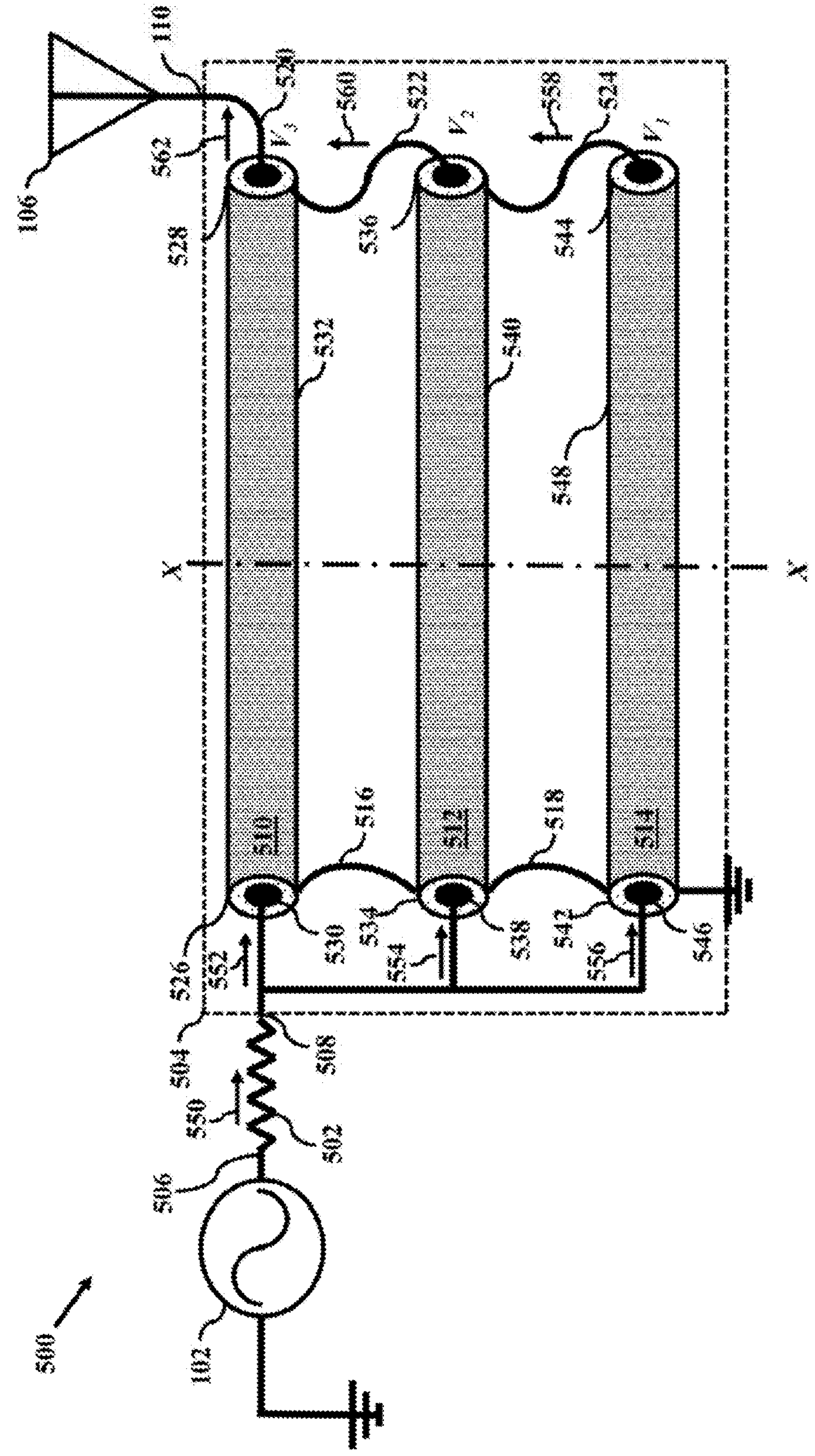
FIG. 5 illustrates a short whip antenna transmission system for transmitting at least 30 MHz.

FIG. 5 illustrates a short whip antenna transmission system 500 for transmitting at least 30 MHz.

As shown in the figure, transmission system 500 includes signal generator 102, impedance-matching resistor 502, a transmission line transformer 504 and antenna 106. Signal generator 102 is connected to impedance-matching resistor 502 at a node 506. Impedance-matching resistor 502 is connected to transmission, line transformer 504 at as node 508 and transmission line transformer 504 is connected to antenna 106 at node 110.

Transmission line transformer 504 includes a coaxial transmission line 510, a coaxial transmission line 512, a coaxial transmission line 514, a conducting line 516, a conducting line 518, a conducting line 520, a conducting line 522 and a conducting line 524. Coaxial transmission line 510 has an end 526, an end 528, an inner conducting core 530 and an outer conducting sheathing 532. Coaxial transmission line 512 has an end 534, an end 536, an inner conducting core 538 and an outer conducting sheathing 540. Coaxial transmission line 514 has an end 542, an end 544, an inner conducting core 546 and an outer conducting sheathing 548.

Inner conducting core 530 at end 526, inner conducting core 538 at end 534 and inner conducting core 546 at end 542 are connected at node 508. Outer conducting sheathing 532 at end 526 is connected to outer conducting sheathing 540 at end 534 via conducting line 516. Outer conducting sheathing 540 at end 534 is connected to outer conducting sheathing 548 at end 542 via conducting line 518. Inner conducting core 546 at end 544 is connected to outer conducting sheathing 540 at end 536 via conducting line 524. Inner conducting core 538 at end 536 is connected to outer conducting sheathing 532 at end 528 via conducting line 522. Inner conducting core 530 is connected to node 110 via conducting line 520.

In this arrangement, coaxial transmission lines 510, 512 and 514 are arranged in parallel with node 508, but are arranged in series with respect to node 110. In this example, each of coaxial transmission lines 510, 512 and 514 have equal impedance. In this arrangement, a signal 550 generated by signal generator 102 is split evenly between coaxial transmission lines 510, 512 and 514, wherein inner conducting core 530 receives a signal 552, inner conducting core 538 receives a signal 554 and inner conducting core 556 receives a signal 556.

A signal 558 conducts from inner conducting core 546 at end 544 through line 524 to ground via outer conducting sheathing 540. A signal 560 conducts from inner conducting core 538 at end 536 through line 522 to ground via outer conducting sheathing 532. A signal 562 conducts from inner conducting core 530 at end 528 through line 520 to antenna 106 via node 110.

Figure 6:
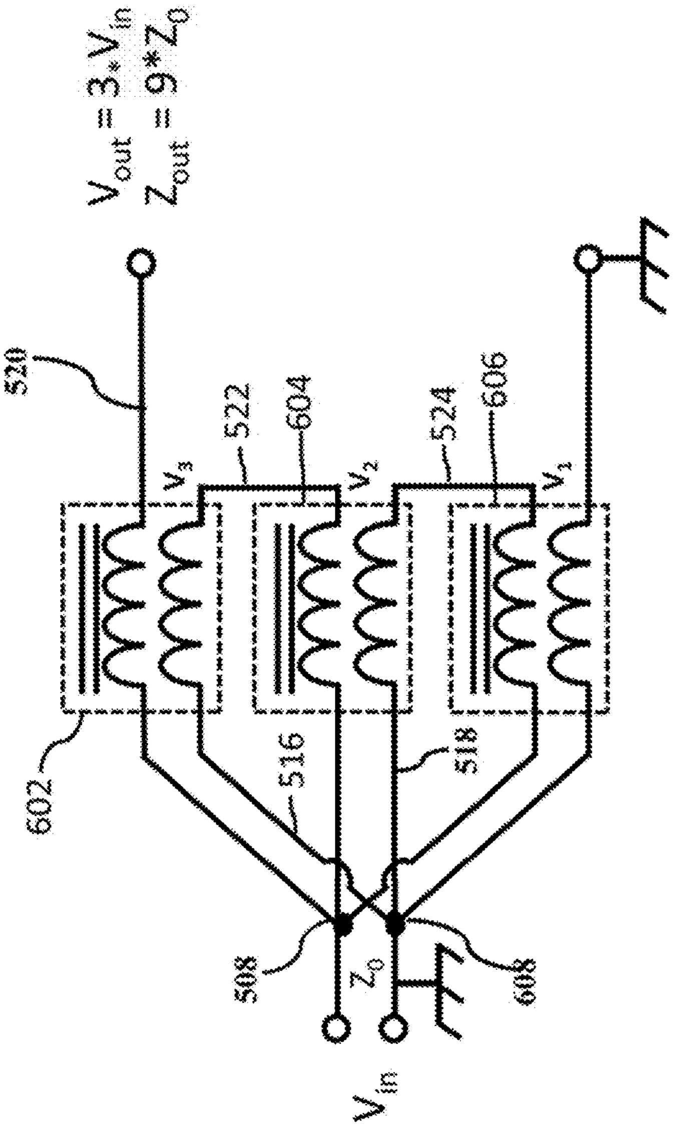
FIG. 6 illustrates a schematic of the transformer of FIG. 5.

FIG. 6 illustrates a schematic of transmission line transformer 504 of FIG. 5.

As shown in FIG. 6, dotted rectangle 602 corresponds to coaxial transmission line 510, dotted rectangle 604 corresponds to coaxial transmission line 512 and dotted rectangle 606 corresponds to coaxial transmission line 514. The inside of each of dotted rectangle 602, 604 and 606 are illustrated as a winding, inductor-type of transformer merely to illustrate that each acts as a transformer in the RF region. In each of dotted rectangle 602, 604 and 606, the upper winding corresponds to the inner conducting core of the corresponding coaxial transmission line, whereas the lower winding corresponds to the outer conducting sheathing of the corresponding coaxial transmission line.

As shown by a node 608 line 516, line 518 and a portion of dotted rectangle 606 are connected to ground. As such as additionally shown in FIG. 5, outer conducting sheathing 532 of coaxial transmission line 510, outer conducting sheathing 540 of coaxial transmission line 512 and outer conducting sheathing 548 of coaxial transmission line 514 are all connected to ground.

With additional reference to FIG. 5, a voltage $V_1$ is generated between outer conducting sheathing 548 (at ground) and inner conducting core 546 of coaxial transmission line 514 as provided by node 508. $V_1$ is conducted to outer conducting sheathing 540 (also at ground). A voltage $V_2$ is generated between outer conducting sheathing 540 (at ground) and inner conducting core 538 of coaxial transmission line 512 as provided by node 508. $V_2$ is conducted to outer conducting sheathing 532 (also at ground). A voltage $V_3$ is generated between outer conducting sheathing 532 (at ground) and inner conducting core 530 of coaxial transmission line 510 as provided by node 508. $V_3$ is conducted to node 110 via line 520.

With this arrangement, the input voltage, $V_1$, is transformed to the output voltage, $V_0$, as follows;

$$V_0 = nV_1, \tag{1}$$

where n is the number of coaxial transmission lines in transmission line transformer. Further, the input impedance, $Z_1$, is transformed to the output impedance, $Z_0$, as follows:

$$Z_0 = n^2 Z_1, \tag{2}$$

In this example, with three (3) coaxial transmission lines. $V_0=3\ V_1$ and $Z_0=9\ Z_1$.

In an example working embodiment, a signal generator was used that included an output impedance (at node 506) of about 50 Ω and a short whip antenna included an input impedance of about 300 Ω (at node 110). A coaxial cable having an impedance of 93 Ω was chosen for the transmission line transformer, as it was readily commercially available.

Because inner conducting core 530, inner conducting core 538 and inner conducting core 546 are connected in parallel at node 508, the total input impedance, $Z_1$, of transmission line transformer 504 as seen from node 508 may be calculated by the following:

$$1/Z_1 = 1/Z_{530} + 1/Z_{538} + 1/Z_{546}, \tag{3}$$

Wherein $Z_{530}$ is the impedance of inner conducting core 530. $Z_{538}$ is the impedance of inner conducting core 538 and $Z_{546}$ is the impedance of inner conducting core 546. Let all of the coaxial transmission lines be of the same manufacture and dimension, such that:

$$Z_{530} = Z_{538} = Z_{546} = Z_C, \tag{4}$$

wherein $Z_C$ is the impedance of any of the inner conducting cores. Substituting terms from equation (4) into equation (3) reveals that:

$$1/Z_1 = 3/Z_C. \tag{5}$$

Inversing equation (5) concludes that:

$$Z_1 = Z_C/3. \tag{6}$$

Equation (6) may be extrapolated to the known principle that the total impedance, $Z_T$, of a plurality, n, of impedances elements each having an impedance, Z, and which are connected in parallel is:

$$Z_T = Z/n. \tag{7}$$

In transmission line transformer 504, the total input impedance as viewed from node 508 is equal to the impedance of one of the coaxial transmission lines (presuming each of coaxial transmission lines 510, 512 and 514 have the same impedance) divided by three. As shown from equation (7), in this example, n=3.

With a 93 Ω coaxial transmission line used for coaxial transmission lines 510, 512 and 514, the input impedance as viewed from node 108 is 31 Ω (i.e., 93 Ω/3) because they are arranged in parallel. Following equation (2) discussed above, the output impedance from at node 110 would then be 279 Ω (i.e., $3^2$*31), The output impedance of transmission line transformer 504 of 279 Ω closely matches the 300 Ω input impedance of short whip antenna 106.

To more closely match in input impedance of transmission line transformer 504 of 31 Ω with the 50 Ω output impedance of signal generator 102, a 7.5 Ω resistor is added as impedance-matching resistor 502.

Even though transmission line transformer 504 may effectively match the output impedance at node 508 with the input impedance at node 110, as mentioned earlier, there are common-mode currents generated that must be addressed. In particular, if common-mode currents are allowed to flow, these currents will effectively short node 508 to ground. This will occur because coaxial transmission lines 510, 512 and 514 are electrically short (in wavelengths). The effect of shorting the input (node 508 in this case) to ground will destroy all performance. This is obvious if one evaluates the network at DC. Only if common-mode currents (currents flowing on the outside surfaces of conducting sheathing 532 and conducting sheathing 540) are eliminated or drastically reduced, does the transmission-line transformer perform as discussed with reference to FIG. 6.

Figure 7:
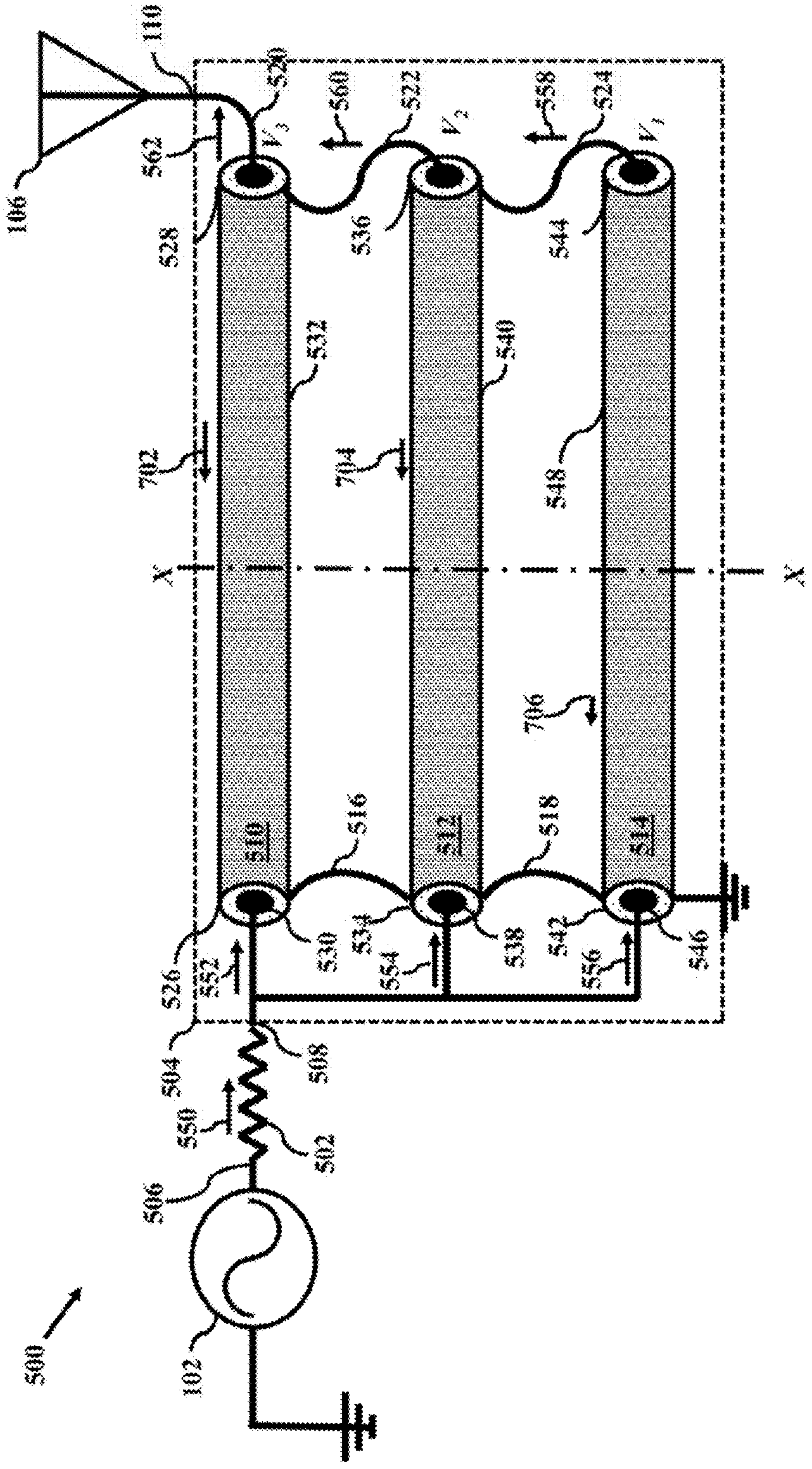
FIG. 7 illustrates common-mode currents within transmission system of FIG. 5.

FIG. 7 illustrates common-mode currents within transmission system 500.

$V_1$ at end 544 of coaxial transmission line 514 unbalances the currents between conducting core 546 and conducting coaxial sheathing 548. This unbalance creates a common-mode current 706 toward ground.

Similarly $V_2$ at end 536 of coaxial transmission line 512 unbalances the currents between conducting core 538 and conducting coaxial sheathing 540. This unbalance creates a common-mode current 704 toward ground. Because $V_2$ includes $V_1$, common-mode current 704 is twice the magnitude of common-mode current 706. Finally, $V_3$ at end 528 of coaxial transmission line 510 unbalances the currents between conducting core 530 and conducting coaxial sheathing 532. This unbalance creates a common-mode current 702 toward ground. Because $V_3$ includes $V_1$ and $V_2$, common-mode current 702 is three times the magnitude of common-mode current 706.

Common-mode currents may alternatively be explained using a voltage analysis. This analysis works at any RF frequency, but is understandable even at DC.

Conducting line 524 is at voltage $V_1$ and thus raises the potential of end 536 to $V_1$. This voltage tries to induce a current to flow back to ground on the outside of coaxial transmission line 512. If coaxial transmission lines 510, 512 and 514 are short (in wavelengths, which these are), then no significant amount of current 558 can be allowed to flow back to node 508 as common-mode current 704. To the extent that current 558 flows into common-mode current 704, it would "short" the outer conducting sheathing 548 back to ground (0 volts), thus eliminating the desired stepped-up voltage effect for from transmission line transformer 504.

Similarly, conducting line 522 is trying to raise the voltage on outer conducting sheathing 532 of coaxial transmission lines 510 at end 528 to $2V_1$. This double voltage tries twice as hard to induce common-mode current 702 to short out the stepped-up voltage. Thus, based on this analysis, no current choke is needed on coaxial transmission line 514 because common-mode currents flowing in coaxial transmission line 514 are of relatively little concern. Common-mode current chokes on coaxial transmission lines 512 and 510, and the choking effects needed are proportional to the voltages trying to induce common-mode current to flow. Thus twice the choking effect is needed on coaxial transmission line 510 as on coaxial transmission line 512, because the voltage on end 528 is twice the voltage as on end 536.

Common-mode currents 702, 704 and 706 each oscillate in accordance with the frequency of signal 550 as provided by signal generator 102. The direct connection effect of common-mode currents 702, 704 and 706 degrades the desired matching network performance by shorting input to ground, reducing input impedance, and reducing the desired current flowing into short whip antenna 106. This all leads to reduced radiation from short whip antenna 106 and increased losses, as all of that extra current flows through matching resistor 502 and other lossy elements. Accordingly, it is a goal to eliminate—or at the very least drastically reduce—common-mode currents in a transmission line transformer used with a short whip antenna. This may be accomplished by choking the common-mode currents using increased impedance material on the transmission lines within the transmission line transformer. This will be described in greater detail with reference to FIG. 8.

Figure 8:
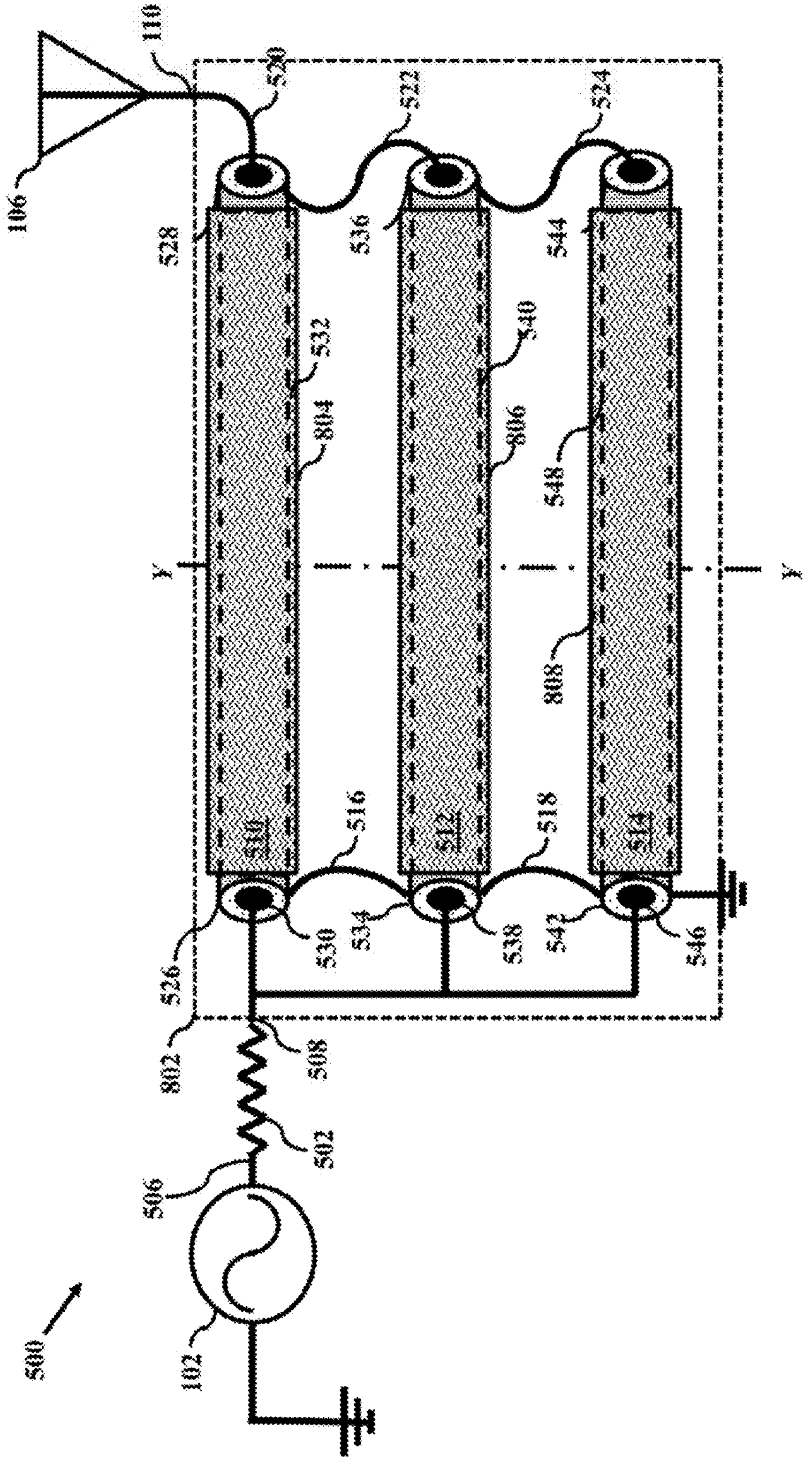
FIG. 8 illustrates another short whip transmission system for transmitting at least 30 MHz.

FIG. 8 illustrates another short whip transmission system 800 for transmitting at least 30 MHz.

As shown in the figure, transmission system 800 includes signal generator 102, impedance-matching resistor 502, a transmission line transformer 802 and antenna 106. Impedance-matching resistor 502 is connected to transmission line transformer 802 at a node 508 and transmission line transformer 802 is connected to antenna 106 at a node 110.

Transmission line transformer 802 includes coaxial transmission line 510, coaxial transmission line 512, coaxial transmission line 514, conducting line 516, conducting line 518, conducting line 520, conducting line 522, conducting line 524, an impedance increasing material 804, an impedance increasing material 806 and an impedance increasing material 808. Impedance increasing material 804 surrounds the length of coaxial transmission line 510. Impedance increasing material 806 surrounds the length of coaxial transmission line 512. Impedance increasing material 808 surrounds the length of coaxial transmission line 514.

Impedance increasing material 804 acts as a common-mode current choke prevent common-mode currents on coaxial transmission line 510. Similarly, impedance increasing material 806 acts as a common-mode current choke on coaxial transmission line 512 and impedance increasing material 808 acts as a common-mode current choke on coaxial transmission line 514.

A problem with employing impedance increasing material on all the coaxial transmission lines within a transmission line transformer is that the cross-sectional area of the transmission line transformer is increased. If the transformer must be used within a predefined are, such as within heat sink 208 of FIG. 2, it will not fit. This will be described in greater detail with reference to FIG. 9.

Figure 1:
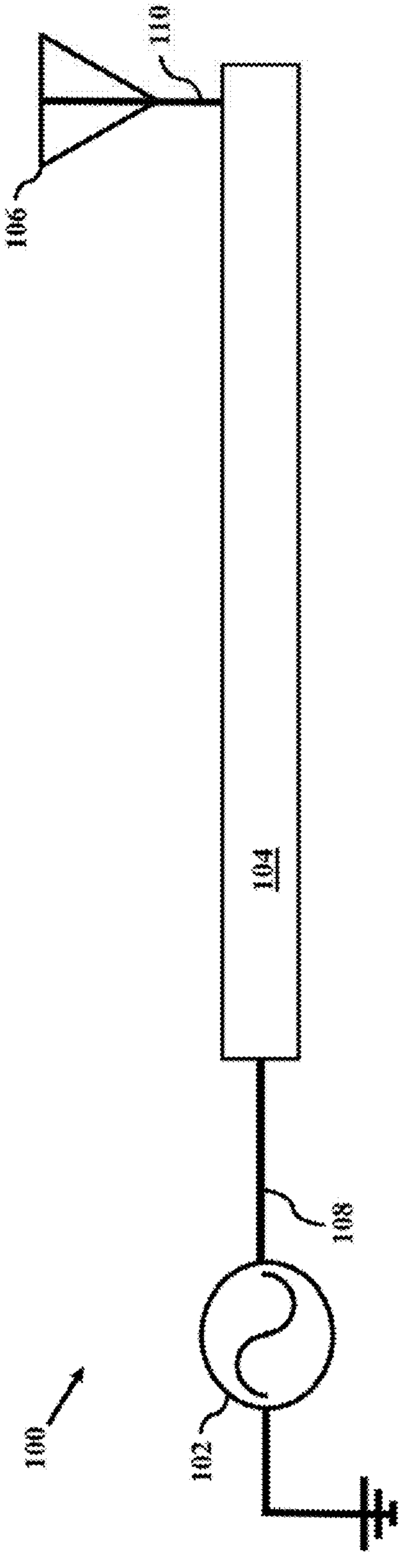
FIG. 1 Prior Art
FIG. 1 illustrates a short whip antenna transmission system.
Figure 2:
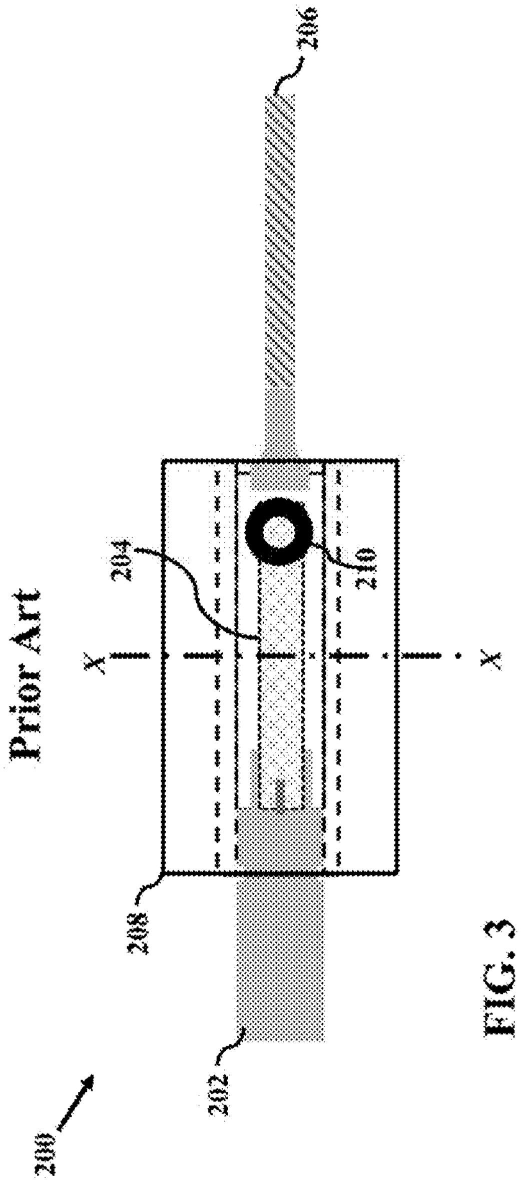
FIG. 2 Prior Art
FIG. 2 illustrates a conventional short antenna for transmitting at least 90 MHz.
Figure 3:
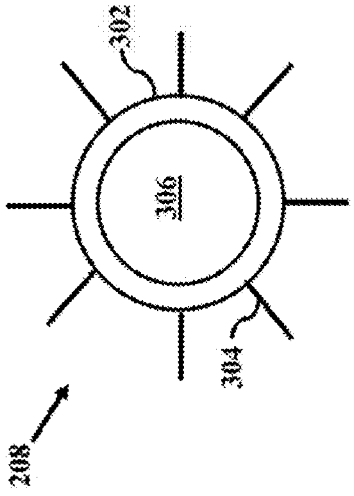
FIG. 3 Prior Art
FIG. 3 illustrates a cross-sectional view of the heat sink along plane X-X of FIG. 2.
Figure 4:
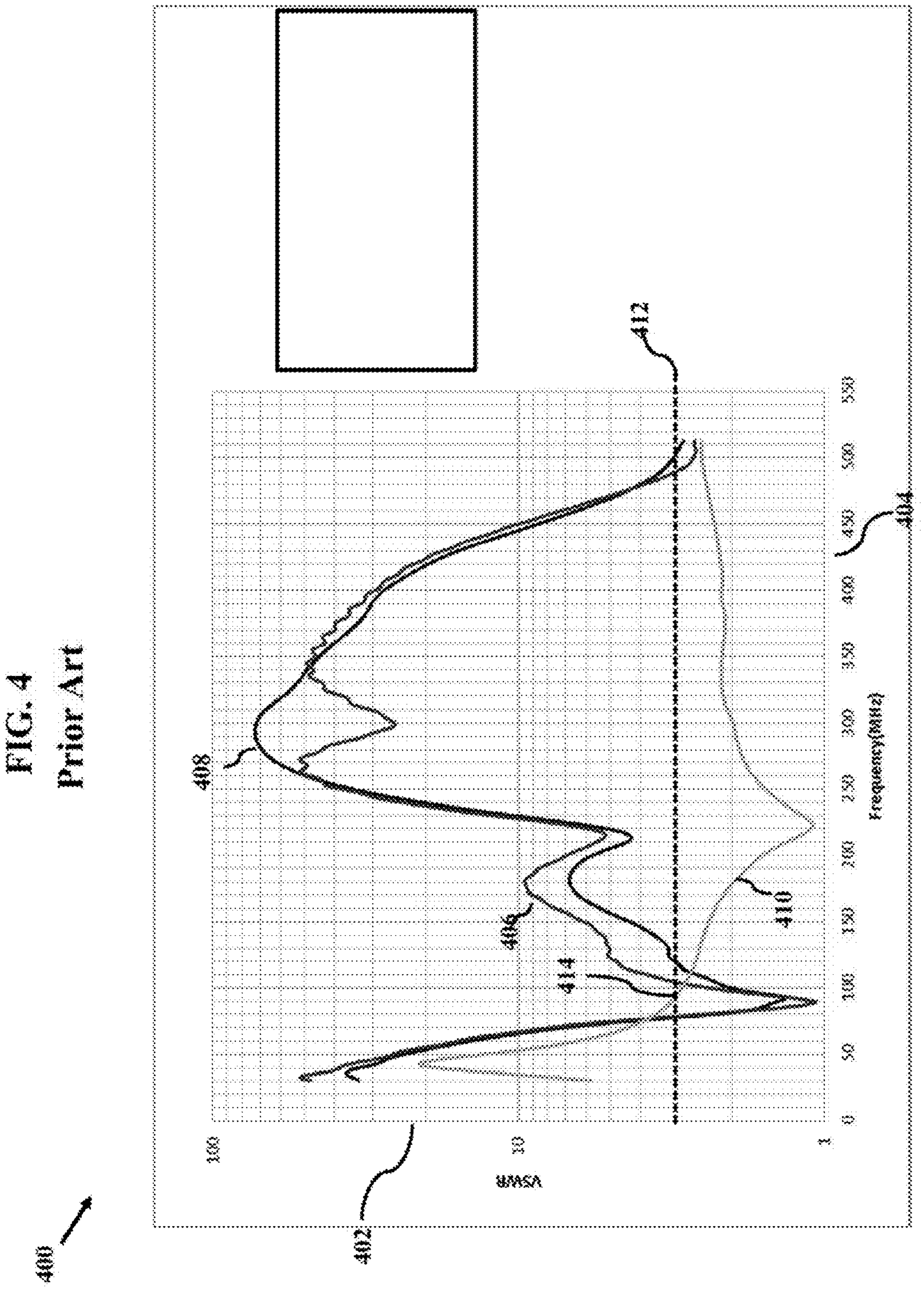
FIG. 4 Prior Art
FIG. 4 illustrates a graph of the efficiently radio-frequency power as transmitted from a power source, through a transmission line, into a load as a function of frequency of the driving signal.
Figure 9:
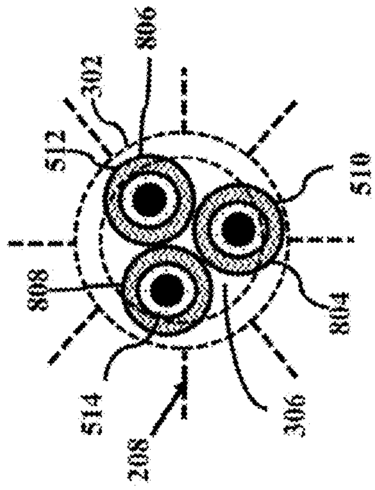
FIG. 9 illustrates a cross-sectional view of heat sink of FIG. 2 along plane X-X, if it were attempted to be used in conjunction with the transformer of FIG. 8.

FIG. 9 illustrates a cross-sectional view of heat sink 208 along plane X-X of FIG. 2, if it were attempted to be used in conjunction with transmission line transformer 802.

As shown in FIG. 9, coaxial transmission line 510 with impedance increasing material 804, coaxial transmission line 512 impedance increasing material 806 and coaxial transmission line 514 impedance increasing material 808 are situated so as to be enclosed within hollow center 306 of tubular body 302.

Clearly, as shown in the figure, the increased diameter of the combination of impedance increasing material 804 and coaxial transmission line 510, and similarly with coaxial transmission line 512 impedance increasing material 806 and coaxial transmission line 514 impedance increasing material 808, would prevent such a transmission line transformer from fitting within hollow center 306. This leads to another aspect of the present invention.

In accordance with another aspect of the present invention, beads of impedance increasing material are disposed so as to minimize the cross-sectional area of the transmission line transformer. This will be described with additional reference to FIG. 10.

Figure 10:
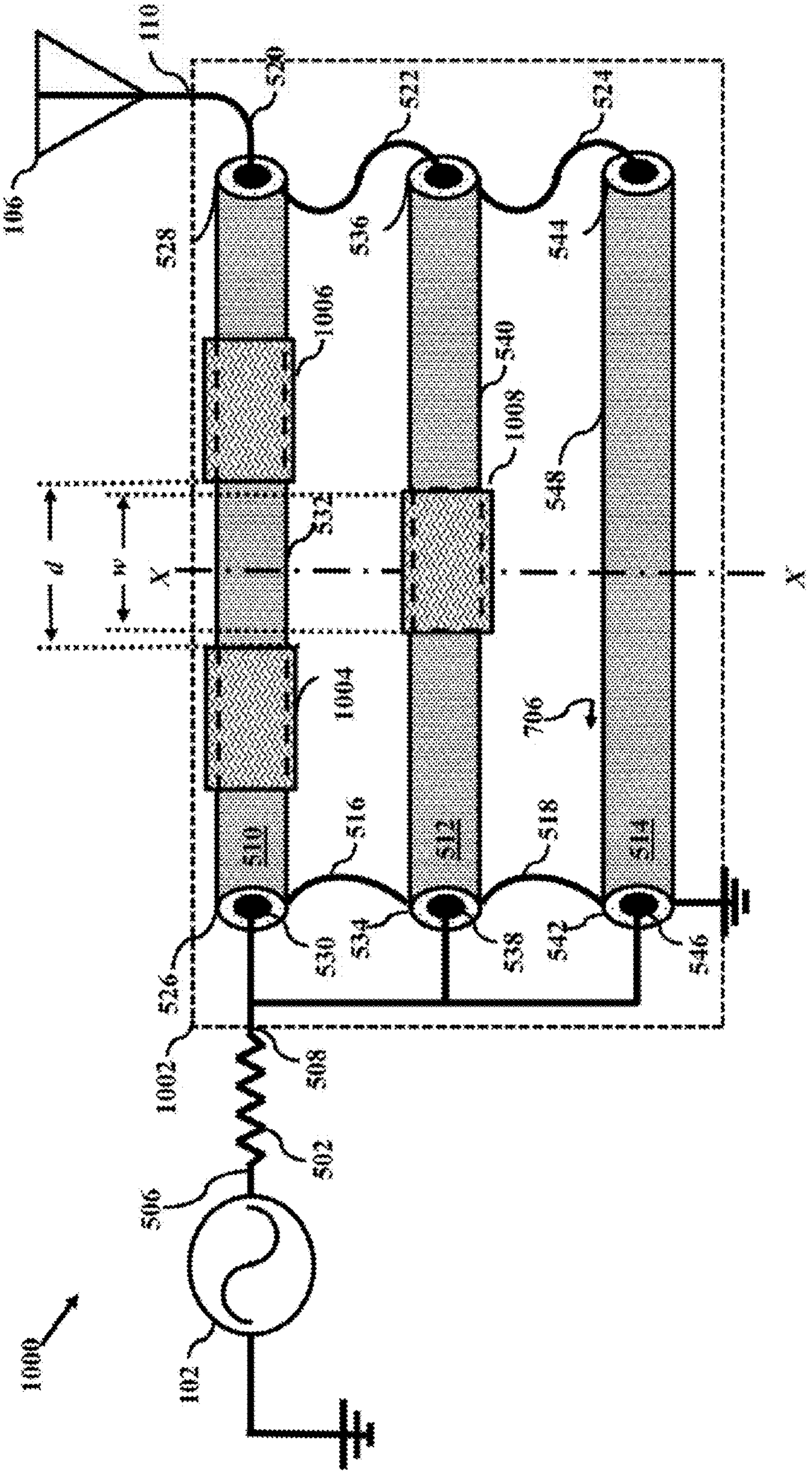
FIG. 10 illustrates an example short whip transmission system for transmitting below 30 MHz in accordance with aspects of the present invention.

FIG. 10 illustrates an example short whip transmission system 1000 for transmitting below 30 MHz in accordance with aspects of the present invention.

As shown in the figure, transmission system 1000 includes signal generator 102, impedance-matching resistor 502, a transmission line transformer 1002 and antenna 106. Impedance-matching resistor 502 is connected to transmission line transformer 1002 at a node 508 and transmission line transformer 1002 is connected to antenna 106 at a node 110.

Transmission line transformer 1002 includes coaxial transmission line 510, coaxial transmission line 512, coaxial transmission line 514, conducting line 516, conducting line 518, conducting line 520, conducting line 522, conducting line 524, a bead 1004 of impedance increasing material, a bead 1006 of impedance increasing material and a bead 1008 of impedance increasing material. Bead 1004 surrounds a portion coaxial transmission line 510, bead 1006 surrounds another portion of coaxial transmission line 510 and bead 1008 surrounds a portion of coaxial transmission line 512. Bead 1004 is longitudinally separated from bead 1006 by a distance d. Bead 1008 had a width w.

In accordance with aspects of the present invention, beads of impedance increasing material provide a stepped common-mode current reduction to maximize common-mode current reduction while minimizing the cross sectional area of the transmission line transformer. In this embodiment, there is no common-mode current choke for coaxial transmission line 514. Bead 1008 is a first step of a common-mode current choke, which in this ease is for coaxial transmission line 512. Beads 1004 and 1006 are a second increased step of a common-mode current choke, which in this case is for coaxial transmission line 510.

Returning to FIG. 7, because common-mode current 702 is much larger in magnitude than common-mode current 704, it requires the largest common-mode current choke. As such coaxial transmission line 510 has two beads of impedance increasing material. In this light, common-mode current 704 requires less common-mode current choke than common-mode current 702. As such, coaxial transmission line 512 only has one bead of impedance increasing material. In this case, beads 1004 and 1006 are sufficient to choke common-mode current 702 and bead 1008 is sufficient to choke common-mode current 704. Further, it has been determined that common-mode current 706 in coaxial transmission line 514 is so sufficiently small that its negligible, negative affect on the radiated signal from short whip antenna 106 can be tolerated at the expense of the saved cross sectional area from not having impedance increasing material.

In essence, a has been determined that the use of impedance increasing material throughout the length of each of coaxial transmission lines 510, 512, and 514, as discussed above with reference to FIG. 8, is overkill for suppressing common-mode currents. Further, this overkill needlessly increases the overall cross-sectional area of the line transformer to the point that it will not fit within heat sink 208, as discussed above with reference to FIG. 9. Accordingly smaller beads of impedance increasing material are be used, wherein the beads are disposed so as to not overlap one another when the coaxial transmission lines are placed next to one another. This will be shown with reference to FIG. 11.

Figure 11:
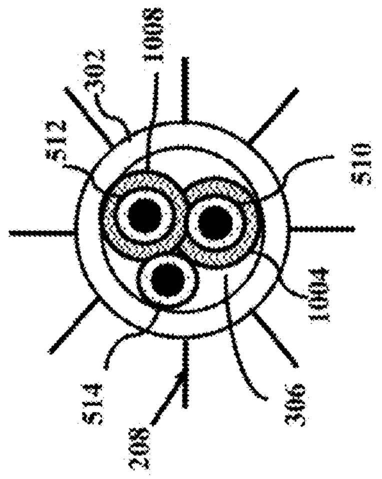
FIG. 11 illustrates a cross-sectional view of the heat sink of FIG. 2 along plane X-X, as used in conjunction with the transformer of FIG. 10.

FIG. 11 illustrates a cross-sectional view of heat sink 208 along plane X-X of FIG. 2, as used in conjunction with transmission line transformer 1002.

As shown in FIG. 11, coaxial transmission line 510, coaxial transmission line 512 and coaxial transmission line 514 are situated so as to be enclosed within hollow center 306 of tubular body 302.

In this example, bead 1008 on coaxial transmission line 512 fits between beads 1004 and 1006, so as to rest on coaxial transmission line 510. Similarly, beads 1004 and 1006 on coaxial transmission line 510 fit around bead 1008, so as to rest on coaxial transmission line 512. Further, coaxial transmission line 514 can rest against beads 1004, 1006 and 1008. With this arrangement, transmission line transformer 1002 can fit within hollow center 306 and the common-mode currents are drastically choked. The performance benefits of the transmission line transformer 1002 will now be described with reference to FIG. 12.

Figure 12:
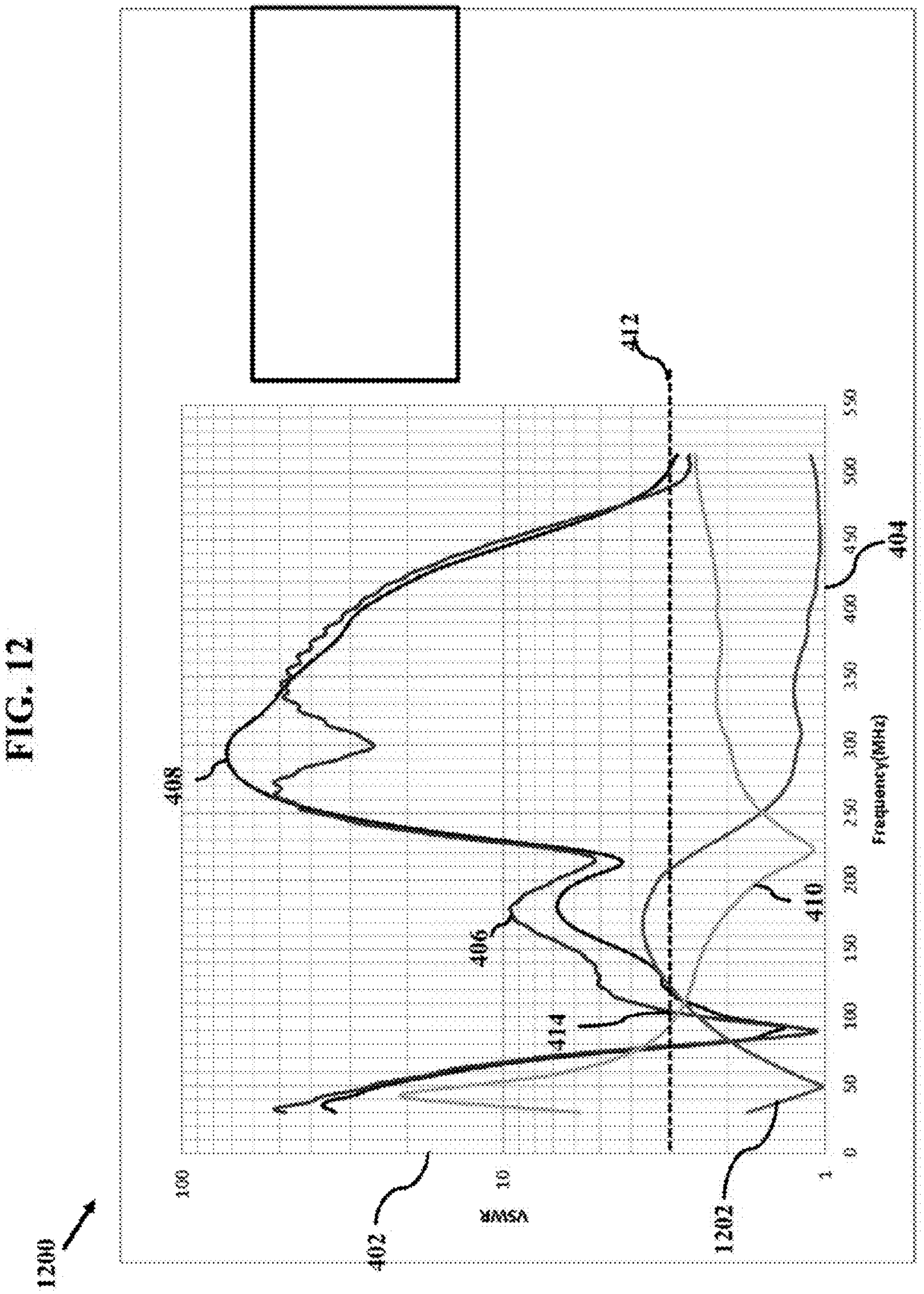
FIG. 12 illustrates another graph of the efficiently radio-frequency power as transmitted from a power source, through a transmission line, into a load as a function of frequency of the driving signal.

FIG. 12 illustrates a graph 1200 of VSWR as a function of frequency of the driving signal.

As shown in the figure, graph 1200 includes Y-axis 402, X-axis 404, function 406, function 408, function 410, a function 1202 and dotted line 412.

Function 1202 corresponds to the VSWR as a function of frequency of a transmission system having a short whip antenna similar to that as illustrated in FIG. 2, but using transmission line transformer 1002 of FIG. 10.

As shown in the graph, function 1002 has a VSWR value below 3 from about 30-120 MHz and greater than about 210 MHz. Further function 1002 has a VSWR value below 4 from about 120-210 MHz.

The example transmission line transformer discussed above with reference to FIG. 10 includes three coaxial transmission lines. However, any number greater than two may be used. As discussed above with reference to equations (1) and (2), the output voltage as a function of the input voltage and the output impedance as a function of the input impedance may be determined fur the number of coaxial transmission lines used. Other example transmission line transformers will now be described with reference to FIGS. 13-14.

Figure 13:
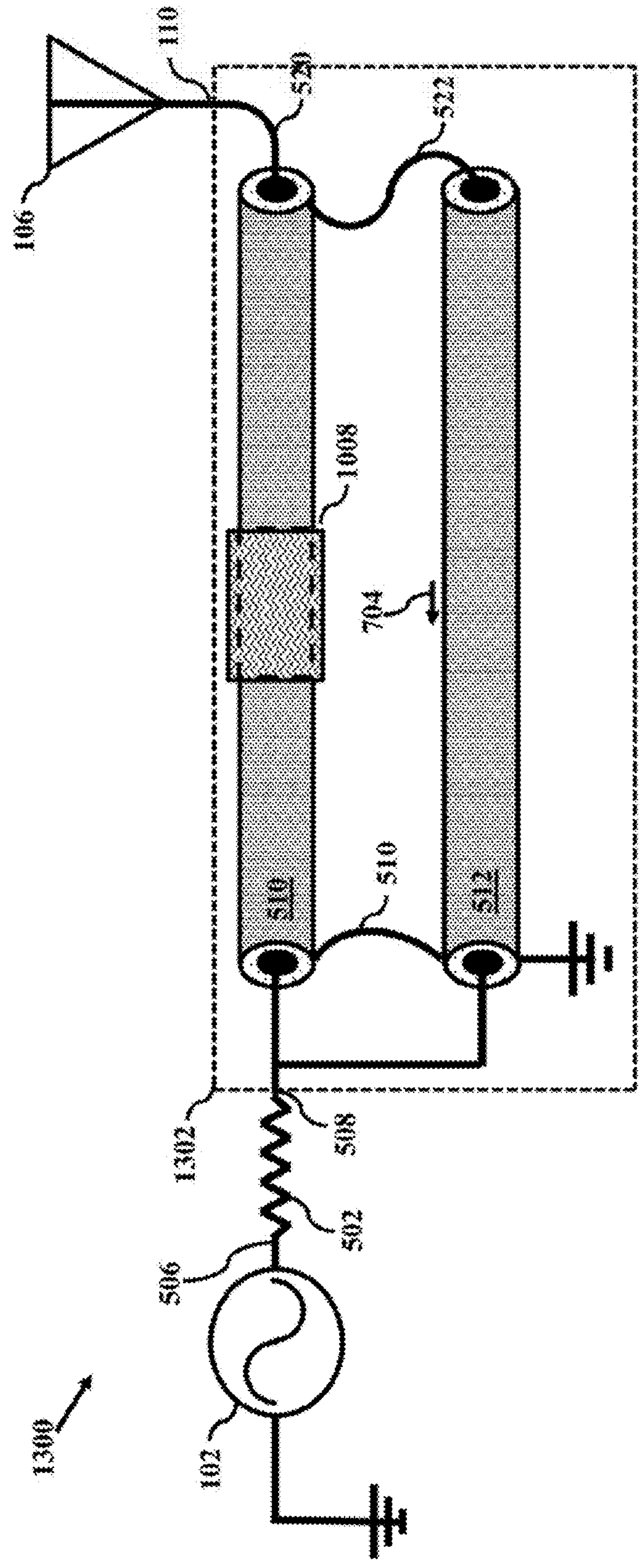
FIG. 13 illustrates another example short whip transmission system in accordance with aspects of the present invention.

FIG. 13 illustrates another example short whip transmission system 1300 in accordance with aspects of the present invention.

As shown in the figure, transmission system 1300 includes signal generator 102, impedance-matching resistor 502, a transmission line transformer 1302 and antenna 106. Impedance-matching resistor 502 is connected to transmission line transformer 1302 at a node 508 and transmission line transformer 1302 is connected to antenna 106 at a node 110.

Transmission line transformer 1302 includes coaxial transmission line 510, coaxial transmission line 512, conducting line 516 conducting line 520, conducting line 522 and bead 1008 of impedance increasing material.

In this example embodiment, transmission line transformer 1302 includes two coaxial transmission lines. From equation (1) above, n=2 in this example. As such transmission line transformer 1302 would provide $V_0$ at node 110 as $2V^1$ at node 508, and would provide $Z_0$ at node 110 as $4Z_1$ at node 508.

With the stepped common-mode current reduction, only bead 1008 is used on coaxial transmission line 510. This leaves common-mode current 704 to be tolerated at the expense of the saved cross sectional area from not having impedance increasing material.

Figure 14:
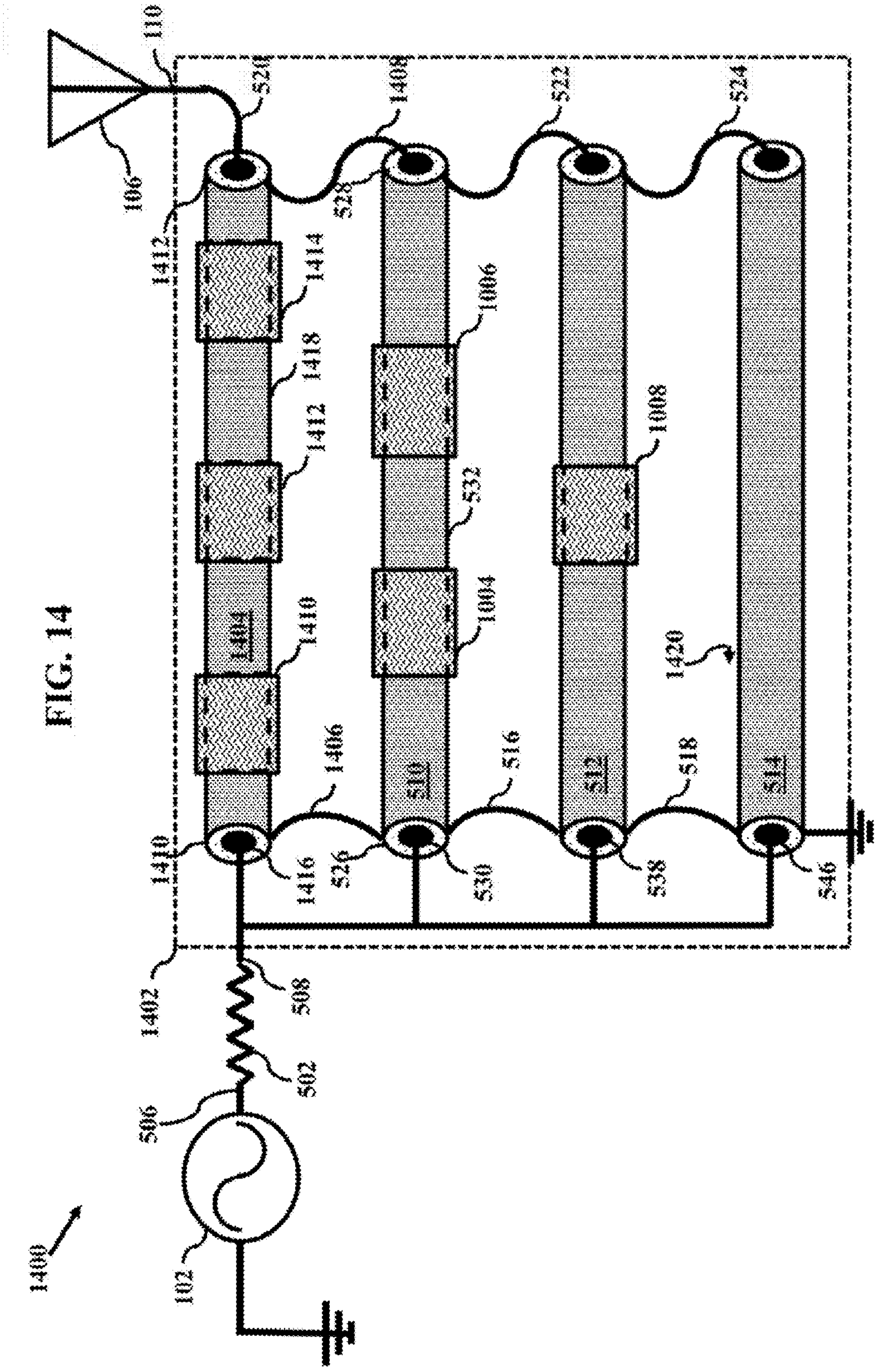
FIG. 14 illustrates another example short whip transmission system in accordance with aspects of the present invention.

FIG. 14 illustrates an example short whip transmission system 1400 in accordance with aspects of the present invention.

As shown in the figure, transmission system 1400 includes signal generator 102, impedance-matching resistor 502, a transmission line transformer 1402 and antenna 106. Impedance-matching resistor 502 is connected to transmission line transformer 1402 at a node 508 and transmission line transformer 1402 is connected to antenna 106 at a node 110.

Transmission line transformer 1402 includes all the elements of transmission line transformer 1002 of FIG. 10, with the addition of a coaxial transmission line 1404, a conducting line 1406, a conducting line 1408, a bead 1410 of impedance increasing material, a bead 1412 of impedance increasing material and a bead 1414 of impedance increasing material. Coaxial transmission line 1404 has an inner conducting core 1416 and an outer conducting sheathing 1418. Bead 1410 surrounds a portion coaxial transmission line 1404 and is separated from bead 1412, which additionally surrounds another portion of coaxial transmission line 1404. Bead 1412 is additionally separated from bead 1414, which surrounds another portion of coaxial transmission line 1404.

In this example embodiment, transmission line transformer 1402 includes four coaxial transmission lines. From equation (1) above, n=4 in this example. As such, transmission line transformer 1402 would provide $V_0$ at node 110 as $4V_1$ at node 508, and would provide $Z_0$ at node 110 as $16Z_1$ at node 508.

With the stepped common-mode current reduction, an additional three beads of impedance increasing material are used the upper most coaxial transmission line.

The non-limiting example embodiments discussed above are provided for purposes of discussion. With a known input impedance to a short whip antenna, a known output impedance of a signal generator and the relationships provided in equations (1), (2), and (7), an efficient transmission line transformer in accordance with the present invention may be designed. Design parameters include: choosing the appropriate number of coaxial transmission lines; choosing the appropriate impedance for the coaxial transmission lines; and, if an optimal impedance for a coaxial transmission line cannot be readily used, choosing an appropriate impedance-matching element to be disposed at least one of between the signal generator and the transmission line transformer and between the transmission line transformer and the short whip antenna. It should also be noted that the foregoing examples describe transformers with n sections having impedance ratios of $n^2$. This technique may also be implemented with other transformer topologies, which provide other impedance ratios.

After creating the optimal transmission line transformer for use with the short whip antenna, beads of impedance increasing material may be used on the coaxial transmission lines to provide a stepped common-mode current reduction while minimizing the cross sectional area of the transmission line transformer.

Conventional transmission line transformers used within a predefined space of a heat sink for short whip antennas were limited in their hand use. A coaxial transmission line transformer in accordance with the present invention enables a short whip antenna to transmit at much lower frequencies with a very low VSWR value. This is accomplished with the use of a stepped common-mode current reduction via spaced beads of impedance increasing material within the transmission line transformer.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A device comprising:

an input port operable to receive an unbalanced input radio frequency signal;

an output port;

a transmission line transformer disposed between said input port and said output port, said transmission line transformer comprising n transmission lines, each of said n transmission lines comprising a first end, a second end separated from said first end by a length, an axial conducting core and a coaxial conducting sheathing electrically separated from said axial conducting core, each of said coaxial conducting sheathings being connected to ground at said first end, an axial conducting core at a second end of one of said transmission lines being electrically connected to a second end of a coaxial conducting sheathing of another of said transmission lines, an axial conducting core at said second end of the another of said transmission lines being electrically connected to said output port;

a first amount of a first impedance increasing material disposed with said one of said transmission lines to inhibit common-mode current from flowing on an outer surface of said coaxial conducting sheathing of said one of said transmission lines; and a second amount of a second impedance increasing material disposed with said another of said transmission lines to inhibit common-mode current from flowing on an outer surface of said coaxial conducting sheathing of said another of said transmission lines, said second amount of a second impedance increasing material being greater than said first amount of a first impedance increasing material.

2. The device of claim 1, wherein n is two, wherein said first amount of a first impedance increasing material is zero, and wherein said second amount of a second impedance increasing material is disposed around a second of said transmission lines.

3. The device of claim 2, wherein said second amount of a second impedance increasing material comprises a hollow tube of a ferrite material.

4. The device of claim 3, wherein said one of said transmission lines comprises a 93 Ohm coaxial cable.

5. The device of claim 4, wherein the resistance of each of said transmission lines has a resistance $R_1$, and wherein said transmission line transformer provides a total output resistance, $R_T$, as $R_T=n^2R_1$.

6. The device of claim 1, further comprising:

a third amount of a third impedance increasing material disposed with a third of said transmission lines to inhibit common-mode current from flowing on an outer surface of a coaxial conducting sheathing of said third of said transmission lines, said third amount of a third impedance increasing material being greater than said first amount of said first impedance increasing material and being less than said second amount of said second impedance increasing material, wherein n is three, wherein said first amount of a first impedance increasing material is zero, wherein said second amount of a second impedance increasing material is disposed around a second of said transmission lines.

7. The device of claim 1, wherein said second amount of a second impedance increasing material comprises a hollow tube of a ferrite material.

8. The device of claim 1, wherein said one of said transmission tines comprises a 93 Ohm coaxial cable.

9. The device of claim 1, wherein the resistance of each of said transmission lines has a resistance $R_1$, and wherein said transmission line transformer provides a total output resistance, $R_T$, as $R_T=n^2R_1$.

10. The device of claim 1, further comprising:

an antenna operable to transmit an unbalanced transmission signal based on the input radio frequency signal;

wherein said output port is disposed between said transmission line transformer and said antenna.

11. The device of claim 10, wherein n is two, wherein said first amount of a first impedance increasing material is zero, and wherein said second amount of a second impedance increasing material is disposed around a second of said transmission lines.

12. The device of claim 11, wherein said second amount of a second impedance increasing material comprises a hollow tube of a ferrite material.

13. The device of claim 12, wherein said one of said transmission lines comprises a 93 Ohm coaxial cable.

14. The device of claim 13, wherein the resistance of each of said transmission lines has a resistance $R_1$, and wherein said transmission line transformer provides a total output resistance, $R_T$, as $R_T=n^2R_1$.

15. The device of claim 10, further comprising:

a resistor connected to said input port; and a heat sink arranged to surround said transmission line transformer and said resistor and to conduct heat away from said resistor.

16. The device of claim 10, wherein a voltage standing wave ratio is less than 3.5 between an input radio frequency signal spectrum of 10 MHz to 515 MHz.

17. A method comprising:

receiving, via an input port, an unbalanced input radio frequency signal;

transforming, via a transmission line transformer, the unbalance input radio frequency signal into a transformed radio frequency signal; and outputting, via an output port, the transformed radio frequency signal, wherein the transmission line transformer is disposed between the input port and the output port, wherein the transmission line transformer comprises n transmission lines, wherein each of the n transmission lines comprises a first end, a second end separated from the first end by a length, an axial conducting core and a coaxial conducting sheathing electrically separated from the axial conducting core, wherein each of the coaxial conducting sheathings are connected to ground at the first end, wherein an axial conducting core at a second end of one of the transmission lines is electrically connected to a second end of a coaxial conducting sheathing of another of the transmission lines, wherein an axial conducting core at the second end of the another of the transmission lines is electrically connected to the output port, wherein a first amount of a first impedance increasing material is disposed with the one of the transmission lines to inhibit common-mode current from flowing on an outer surface of the coaxial conducting sheathing of the one of the transmission lines, wherein a second amount of a second impedance increasing material is disposed with the another of the transmission lines to inhibit common-mode current from flowing on an outer surface of the coaxial conducting sheathing of the another of the transmission lines, and wherein the second amount of a second impedance increasing material is greater than the first amount of a first impedance increasing material.

18. The method of claim 17, further comprising:

transmitting, via an antenna, the transformed radio frequency signal as an unbalanced transmission signal based on the input radio frequency signal, wherein the output port is disposed between the transmission line transformer and the antenna.

19. The method of claim 18, wherein n is two, wherein the first amount of a first impedance increasing material is zero, and wherein the second amount of a second impedance increasing material is disposed around a second of the transmission lines.

20. The method of claim 19, wherein the second amount of a the impedance increasing material comprises a hollow tube of a ferrite material.

* * * * *